United States Patent
Wang et al.

(10) Patent No.: US 7,312,139 B2
(45) Date of Patent: Dec. 25, 2007

(54) METHOD OF FABRICATING NITROGEN-CONTAINING GATE DIELECTRIC LAYER AND SEMICONDUCTOR DEVICE

(75) Inventors: Yu-Ren Wang, Tainan (TW); Ying-Wei Yen, Tongsiao Township, Miaoli County (TW); Michael Chan, Jhubei (TW)

(73) Assignee: United Microelectronics Corp., Hsinchu (TW)

(*) Notice: Subject to any disclaimer, the term of this patent is extended or adjusted under 35 U.S.C. 154(b) by 383 days.

(21) Appl. No.: 11/028,717

(22) Filed: Jan. 3, 2005

(65) Prior Publication Data
US 2006/0148179 A1    Jul. 6, 2006

(51) Int. Cl.
*H01L 21/4763* (2006.01)
*H01L 21/3205* (2006.01)
(52) U.S. Cl. .................. 438/591; 438/770; 438/773; 438/775
(58) Field of Classification Search ................ 438/706, 438/710, 723, 728, 777
See application file for complete search history.

(56) References Cited

U.S. PATENT DOCUMENTS

| | | | |
|---|---|---|---|
| 6,197,702 B1* | 3/2001 | Tanabe et al. ............. | 438/773 |
| 6,541,393 B2* | 4/2003 | Sugizaki et al. ............ | 438/763 |
| 6,730,566 B2* | 5/2004 | Niimi et al. ................. | 438/275 |
| 6,808,993 B2* | 10/2004 | Finnie et al. ............... | 438/287 |
| 6,921,703 B2* | 7/2005 | Bevan et al. ............... | 438/287 |
| 6,924,239 B2* | 8/2005 | Niimi et al. ................. | 438/706 |

OTHER PUBLICATIONS

"Characterization of Hot Wall RTP for Thin Gate Oxide Films" Christopher Ratliff et al./ 9th Intl. Conference on Advanced Thermal Processing of Semiconductors-RTP 2001 / p. 111-114.
"Development of a Manufacturable Low Pressure ROXNOX Oxidation Process" Stephen Bilotta & Dana Proctor / 1994 IEEE/SEMI Advanced Semiconductor Manufacturing Conference/ p. 39-49.
"Diluted Wet Oxidation : A Novel Technique for Ultra Gate Oxide Formation" Yoshikazu Tanabe et al. / 1997 IEEE / p. 49-52.
"Heavy Oxynitridation Technology For Forming Highly reliable Flash-Type Eeprom Tunnel Oxide Films" H. Fukuda et al. / electronics Letters Sep. 10, 1992 vol. 28 No. 19 / p. 1781-1783.

\* cited by examiner

*Primary Examiner*—Zandra V. Smith
*Assistant Examiner*—Khanh Duong
(74) *Attorney, Agent, or Firm*—J.C. Patents

(57) ABSTRACT

A method of fabricating a nitrogen-containing gate dielectric layer is described. First, a gate dielectric layer is formed on a substrate by performing a dilute wet oxidation process. Then, a nitridation step is performed for doping nitrogen into the gate dielectric layer. After that, a re-oxidation step is performed for repairing the nitrogen-doped gate dielectric layer. The above steps are carried out inside the same reaction chamber. Moreover, two or more wafers can be treated inside the reaction chamber at the same time.

30 Claims, 3 Drawing Sheets

METHOD OF FABRICATING NITROGEN-CONTAINING GATE DIELECTRIC LAYER AND SEMICONDUCTOR DEVICE

BACKGROUND OF THE INVENTION

1. Field of the Invention

The present invention relates to a method of fabricating semiconductor. More particularly, the present invention relates to a method of fabricating a nitrogen-containing gate dielectric layer and a semiconductor device.

2. Description of the Related Art

With the progressive drop in the dimension of the metal-oxide-semiconductor (MOS) transistor s, more stringent quality requirements are set up for the gate dielectric layer. When the dimension of a MOS transistor drops to a value smaller than 0.1 μm, the thickness of a gate dielectric layer fabricated using silicon oxide layer must also be reduced to a value below 20 Å. As the thickness of the gate dielectric layer grows thinner and thinner, electrons can easily tunnel through the layer to produce a leakage current if there is any defect in the gate dielectric layer.

Therefore, if the gate dielectric layer is fabricated using silicon oxide material, then a nitridation process is often carried out to adjust the properties of the gate dielectric layer and reduce the leakage current and other electrical problems in the device. In the conventional technique, nitridation is performed through implanting nitrogen into the gate dielectric layer in a plasma process. However, this method frequently damages the internal structure of the gate dielectric and leads to quality problems. Moreover, the cost for carrying out a plasma nitridation process is high.

Conventionally, there is also an alternative thermal process for nitriding of the gate dielectric layer. However, this method will form a deeper nitrogen concentration distribution curve. In other words, the interface between the nitrogen and the silicon oxide is very close to the silicon oxide/substrate interface. Thus, it can easily lead to a flat-band voltage variation and an increase in the trapped charges inside the gate dielectric layer, a major cause of electrical problems. In addition, it may affect the threshold voltage, the difference in work function between the substrate and the gate and the reliability of the device and so lead to negative bias and negative bias temperature instability (NBTI) problem resulting in a drop in the performance of the semiconductor device. Furthermore, the convention method permits a reaction chamber to process only a single wafer at a time, which may result in a bottleneck in production.

SUMMARY OF THE INVENTION

Accordingly, at least one objective of the present invention is to provide a method of fabricating a high-quality nitrogen-containing gate dielectric layer capable of reducing leakage current.

At least a second objective of the present invention is to provide a method of fabricating a semiconductor device capable of processing a plurality of wafers simultaneously inside the same reaction chamber to increase the yield.

To achieve these and other advantages and in accordance with the purpose of the invention, as embodied and broadly described herein, the invention provides a method of fabricating a nitrogen-containing gate dielectric layer. First, a gate dielectric layer is formed on a substrate by performing a dilute wet oxidation process. Then, a nitridation step is performed for doping nitrogen into the gate dielectric layer. After that, a re-oxidation step is performed for repairing the nitrogen-doped gate dielectric layer. The above steps are carried out inside the same reaction chamber. Moreover, two or more wafers can be treated inside the reaction chamber at the same time.

The present invention also provides a method of fabricating a semiconductor device. First, a nitrogen-containing gate dielectric layer is formed over a substrate. The method of fabricating the nitrogen-containing gate dielectric layer includes the following steps. A gate dielectric layer is formed on a substrate by performing a dilute wet oxidation process. Then, a nitridation step is performed for doping nitrogen into the gate dielectric layer. After that, a re-oxidation step is performed for repairing the nitrogen-doped gate dielectric layer. The above steps are carried out inside the same reaction chamber. Moreover, two or more wafers can be treated inside the reaction chamber at the same time. After forming the nitrogen-containing gate dielectric layer, a gate is formed over the nitrogen-containing gate dielectric layer. Using the gate as a mask, a portion of the nitrogen-containing gate dielectric layer is removed. Afterwards, a source and a drain region are formed in the substrate on the respective side of the gate.

According to one preferred embodiment of the present invention, the method of forming the gate in the aforementioned method of fabricating the semiconductor device includes forming a conductive layer over the nitrogen-containing gate dielectric layer. Then, a patterned photoresist layer is formed over the conductive layer. Thereafter, using the patterned photoresist layer as a mask, a portion of the conductive layer is removed. Finally, the patterned photoresist layer is also removed.

According to one preferred embodiment of the present invention, in the step of performing the dilute wet oxidation in the aforementioned method of fabricating the nitrogen-containing gate dielectric layer and the semiconductor device, the partial pressure of wafer vapor is between 0.1~10 Torr, preferably between 0.1~5 Torr and better still between 0.1~1 Torr. Furthermore, the reactive gases for performing the dilute wet oxidation process are oxygen, hydrogen and nitrogen, for example. In addition, the gases for performing the nitridation process is ammonia ($NH_3$) and nitrogen ($N_2$) set in a nitrogen/ammonia ratio of between 0.2~0.8 by volume, for example. Also, the nitridation process is carried out at a temperature between 800~950° C. and a pressure between 10~120 mTorr, for example. Besides, the gas for performing the re-oxidation process is oxygen ($O_2$), water ($H_2O$), nitrogen monoxide (NO) or nitrous oxide ($N_2O$), for example. Moreover, the re-oxidation process is a dilute wet oxidation process or a rapid thermal annealing process. Additionally, in the aforementioned rapid thermal annealing process, the temperature dropping rate is about 30~60° C./minute and the temperature rising rate is about 50~100° C./min, for example.

Using the fabricating method of the present invention, a high-quality nitrogen-containing gate dielectric layer is produced so that current leakage and other electrical problems are improved. Furthermore, the present invention permits a plurality of wafers to be simultaneously treated within the same reaction chamber, thereby significantly increasing the yield. Moreover, the method of the present invention can fabricate semiconductor devices with good electrical properties and reliability.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
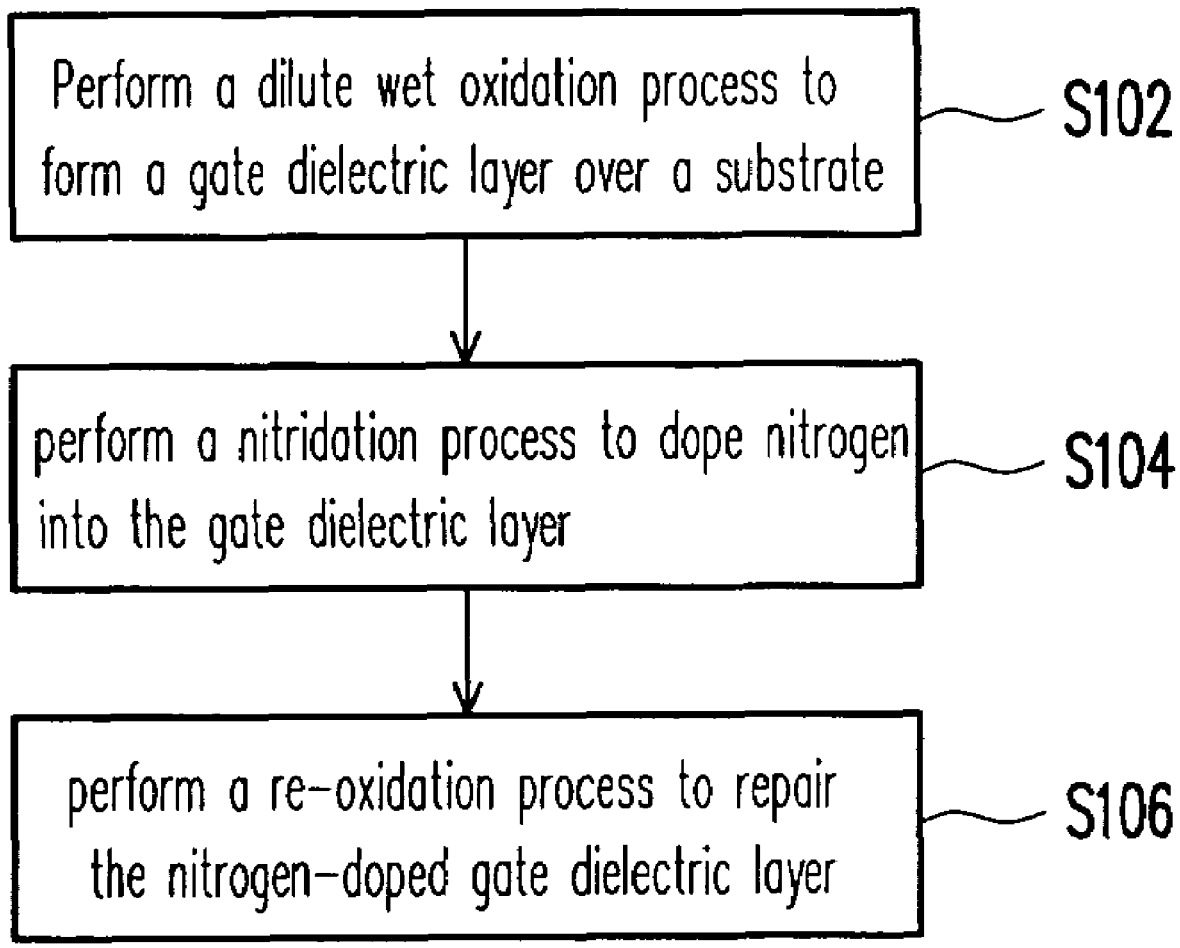
FIG. 1 is a block diagram showing the steps for fabricating a gate dielectric layer according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
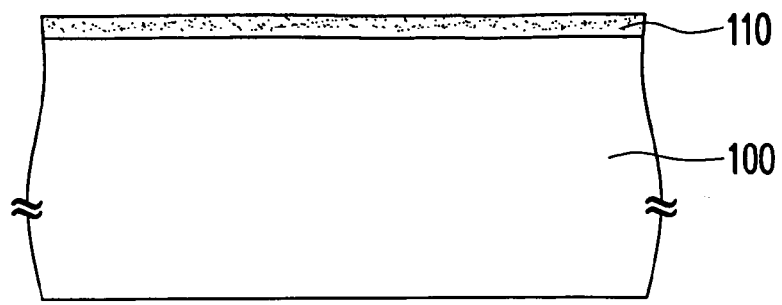
FIGS. 2A through 2C are schematic cross-sectional views showing the steps for fabricating a metal-oxide-semiconductor according to one preferred embodiment of the present invention.
Figure 2B:
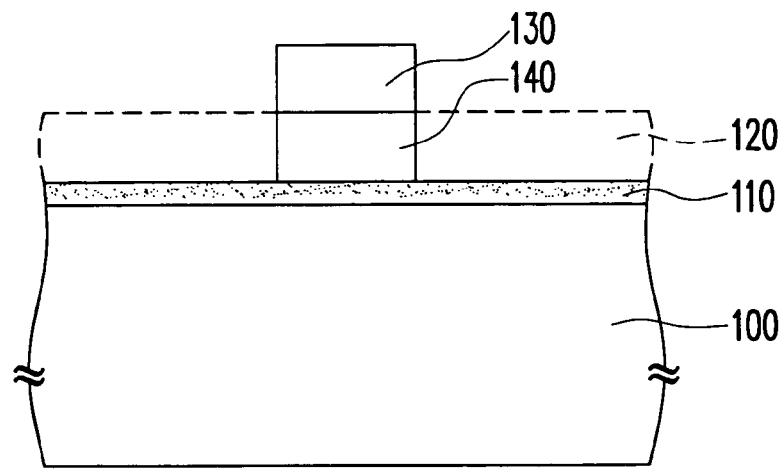
Figure 2C:
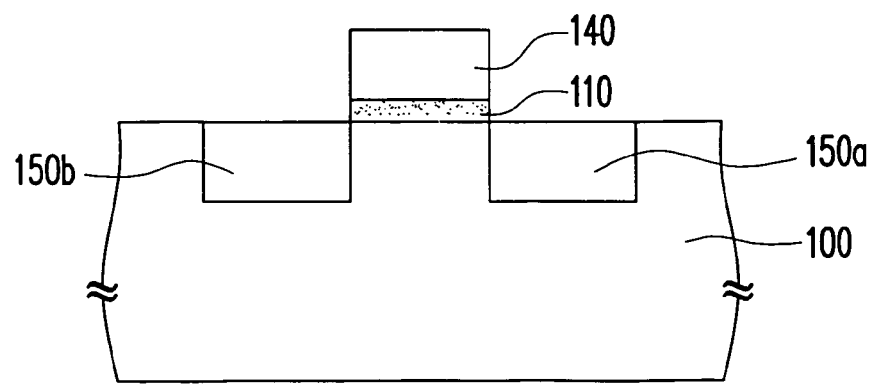

FIG. 1 is a block diagram showing the steps for fabricating a gate dielectric layer according to one preferred embodiment of the present invention. FIGS. 2A through 2C are schematic cross-sectional views showing the steps for fabricating a metal-oxide-semiconductor according to one preferred embodiment of the present invention. As shown in FIG. 2A, an n-type semiconductor substrate 100 is provided. Thereafter, a nitrogen-containing gate dielectric layer 110 is formed over the semiconductor substrate 100. The method of forming the nitrogen-containing gate dielectric layer 110 includes the following steps.

First, as shown in FIG. 1, a dilute wet oxidation process is carried out to form the gate dielectric layer over the substrate (S102). The gate dielectric layer is a silicon oxide layer, for example. In the dilute wet oxidation process (S102), the partial pressure of water vapor is between 0.1~10 Torr, preferably the partial pressure is between 0.1~5 Torr and, better still, the partial pressure is between 0.1~1 Torr. Furthermore, the reaction gases for carrying out the dilute wet oxidation process includes oxygen, hydrogen and nitrogen. In particular, the dilute wet oxidation step (S102) is carried out by passing oxygen and nitrogen into a reaction chamber and then igniting the gases to produce water vapor for oxidizing the silicon substrate. In addition, the nitrogen inside the reaction chamber serves to dilute the reaction gases so that intensive reactions are prevented. In other words, the nitrogen slows down the growth rate of the gate dielectric so that a higher quality gate dielectric layer is produced.

Thereafter, a nitridation step is carried out to dope nitrogen into the gate dielectric layer (S104) so that the dielectric constant of the gate dielectric layer is increased. The gases used for performing the nitridation process include ammonia and nitrogen, for example. The nitrogen and the ammonia are mixed together in a nitrogen/ammonia ratio of about 0.2~0.8 by volume. Moreover, the gas flow rate of the mixture is between 0.2~2 slm. In addition, the nitridation step (S104) is carried out at a temperature of between about 800~950° C. and a pressure of between about 10~120 mTorr.

Afterwards, a re-oxidation step (S106) is carried out for repairing the nitrogen-doped gate dielectric layer to obtain the nitrogen-containing gate dielectric layer 110 shown in FIG. 2A. Through the re-oxidation step (S106), defects on the surface of the nitrogen-doped gate dielectric layer 110 are repaired. The re-oxidation step (S106) is carried out, for example, by performing a rapid thermal annealing process. In the rapid thermal annealing process, the temperature dropping rate is about 30~60° C./minute and the temperature rising rate is about 50~100° C./min, for example. Furthermore, the gas for carrying out the re-oxidation step (S106) includes oxygen, water vapor, nitrogen monoxide or nitrous oxide. Besides using the rapid thermal annealing process to repair the nitrogen-doped gate dielectric layer, in another preferred embodiment of the present invention, a dilute wet oxidation process can be used in the aforementioned re-oxidation step (S106). In other words, the dilute wet oxidation process (S102) mentioned above can be used to repair the nitrogen-doped gate dielectric layer.

It should be noted that the aforementioned steps (S102~S106) of forming the nitrogen-containing gate dielectric layer are carried out in-situ. That means, the aforementioned steps (S102~S106) are carried out to completion in the same reaction chamber. Furthermore, according to the present invention, the reaction chamber can process two or more wafers simultaneously to increase the production rate.

The nitrogen-containing gate dielectric layer 110 formed by the aforementioned method, because of the nitridation (S104), has a higher dielectric constant and hence can reduce the leakage current. In addition, the re-oxidation (S106) provides an effect repair so that a nitrogen-containing gate dielectric layer 110 having a higher quality is produced.

After completing the aforementioned steps (S102~S106) for forming the nitrogen-containing gate dielectric layer 110, as shown in FIG. 2B, a conductive layer 120 is formed over the nitrogen-containing gate dielectric layer 110. The conductive layer 120 is a doped polysilicon layer formed, for example, by performing a chemical vapor deposition process. Thereafter, a patterned photoresist layer 130 is formed over the conductive layer 120, for example, by performing a photolithographic process. Using the patterned photoresist layer 130 as a mask, a portion of the conductive layer 120 is removed to form a gate 140.

As shown in FIG. 2C, the photoresist layer 130 is removed. Thereafter, using the gate 140 as a mask, a portion of the nitrogen-containing gate dielectric layer 110 is removed. The method of removing the nitrogen-containing gate dielectric material includes performing an etching process. After that, a p-type source region 150a and a drain region 150b are formed in the n-type semiconductor substrate 100 on the respective side of the gate 140. The p-type source region 150a and drain region 150b are formed, for example, by implanting dopants such as boron ions into the substrate 100 using the gate 150 as an implantation mask.

According to the method of fabricating the semiconductor device of the present invention, the electrical performance of the semiconductor device is improved in the presence of the nitrogen-containing gate dielectric layer 110. Furthermore, the steps (S102~S106) for fabricating the nitrogen-containing gate dielectric layer 110 can be fabricated in the same place so that the semiconductor fabrication process is very much simplified.

In addition, although the aforementioned embodiment uses p-type metal-oxide-semiconductor as an example, the method described in the present invention can be applied to other types of semiconductor devices including the n-type metal-oxide-semiconductor (NMOS) devices and the complementary metal-oxide-semiconductor (CMOS)

devices as well. In other words, the aforementioned embodiment should not be used to limit the scope of the present invention.

To verify the effectiveness of the nitrogen-containing gate dielectric layer fabricated according to the present invention in improving conventional problems, a measurement of the depth of the nitrogen/silicon oxide interface is carried out after forming the nitrogen-containing gate dielectric layer.

Figure 3:
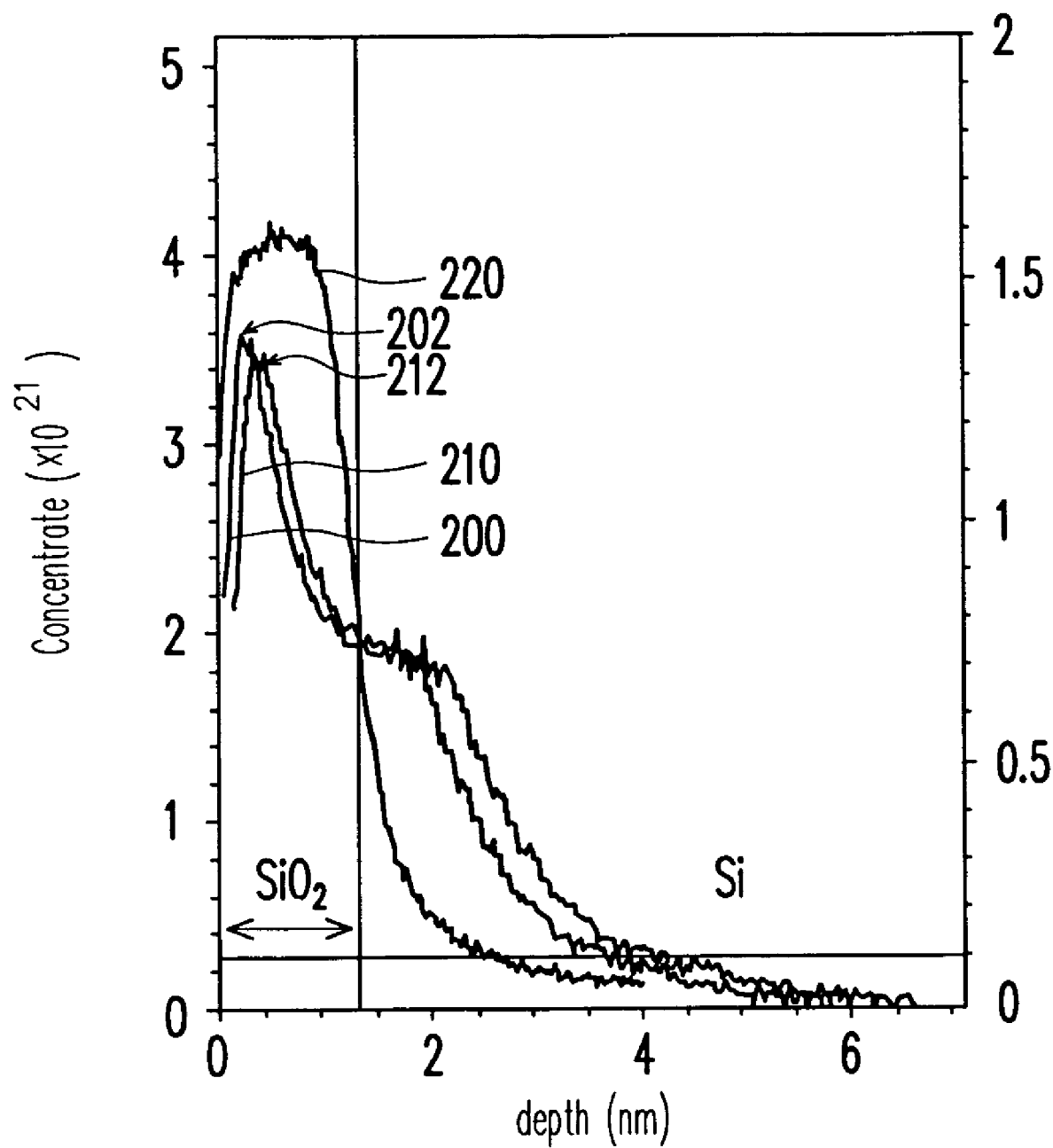
FIG. 3 is a graph showing the nitrogen concentration distribution inside a substrate and a gate dielectric layer.

FIG. 3 is a graph showing the nitrogen concentration distribution inside a substrate and a gate dielectric layer. As shown in FIG. 3, the X-axis represents the depth from the silicon oxide surface to the silicon substrate and the Y-axis represents the value of concentration of nitrogen and oxygen. In addition, the curve 200 shows the variation of the nitrogen concentration with depth according to the present invention. The curve 210 shows the variation of nitrogen concentration with depth according to the conventional fabrication method. The curve 220 shows the variation of oxygen concentration with depth. According to the nitrogen concentration distribution between the gate dielectric layer fabricated according to the present invention and the substrate, the interface between the nitrogen and the silicon oxide in the present invention is formed on the peak concentration point 202 of the curve 200. On the other hand, the interface between the nitrogen and the silicon oxide fabricated using the conventional method is formed on the peak concentration point 212 of the curve 210. Therefore, the present invention has a shallower nitrogen/silicon oxide interface. Consequently, the variation of flatband voltage is improved and the quantity of trapped electric charges inside the gate dielectric layer is reduced.

In summary, the method of the present invention has at least the following advantages:

1. The nitrogen-containing gate dielectric layer is fabricated through a dilute wet oxidation process. Hence, the product film has a better quality. Moreover, the gate dielectric layer thus fabricated not only has a higher dielectric constant, but also has a smaller leakage current.

2. The steps for fabricating the nitrogen-containing layer can be carried out in the same place. Moreover, two or more wafers can be processed inside the same reaction chamber at the same time. Hence, the production rate is increased.

3. The method of the present invention is capable of producing a nitrogen-containing gate dielectric layer with a shallower nitrogen/silicon oxide interface. Hence, flatband voltage variation and the amount of trapped charges inside the gate dielectric layer are reduced.

4. Due to the increase in the dielectric constant in the semiconductor device fabricated according to the present invention, leakage current problem is minimized and the electrical performance of the device is improved.

5. In the present invention, the gate dielectric layer is fabricated inside the same reaction chamber. Hence, the semiconductor fabrication process is very much simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a nitrogen-containing gate dielectric layer, comprising the steps of:
    performing a dilute wet oxidation process to form a gate dielectric layer over a substrate;
    performing a nitridation process to dope nitrogen into the gate dielectric layer; and
    performing an re-oxidation process for repairing the nitrogen-doped gate dielectric layer,
    wherein the dilute wet oxidation process, the nitridation process and the re-oxidation process are all carried out inside the same reaction chamber, and two of more wafers can be processed inside the reaction chamber at the same time.

2. The method of fabricating the gate dielectric layer of claim 1, wherein the partial pressure of the water vapor in the dilute wet oxidation process is set between 0.1~10 Torr.

3. The method of fabricating the gate dielectric layer of claim 1, wherein the partial pressure of the water vapor in the dilute wet oxidation process is set between 0.1~5 Torr.

4. The method of fabricating the gate dielectric layer of claim 1, wherein the partial pressure of the water vapor in the dilute wet oxidation process is set between 0.1~1 Torr.

5. The method of fabricating the gate dielectric layer of claim 1, wherein the reactive gases used in the dilute wet oxidation process comprises oxygen, hydrogen and nitrogen.

6. The method of fabricating the gate dielectric layer of claim 1, wherein the gaseous mixture used in the nitridation process comprises ammonia ($NH_3$) and nitrogen ($N_2$).

7. The method of fabricating the gate dielectric layer of claim 6, wherein the ratio between nitrogen to ammonia in the gaseous mixture is between about 0.2~0.8.

8. The method of fabricating the gate dielectric layer of claim 6, wherein the gas flow rate of the gaseous mixture is between about 0.2~2 slm.

9. The method of fabricating the gate dielectric layer of claim 1, wherein the nitridation process is performed at a temperature between about 800~950° C.

10. The method of fabricating the gate dielectric layer of claim 1, wherein the nitridation process is performed at a pressure between about 10~120 mTorr.

11. The method of fabricating the gate dielectric layer of claim 1, wherein the gas used in the re-oxidation process is selected from a group consisting of oxygen ($O_2$), water vapor ($H_2O$), nitrogen monoxide (NO) and nitrous oxide ($N_2O$).

12. The method of fabricating the gate dielectric layer of claim 1, wherein the re-oxidation process comprises a dilute wet oxidation process or a rapid thermal annealing process.

13. The method of fabricating the gate dielectric layer of claim 12, wherein the rapid thermal annealing process is performed with a temperature dropping rate of about 30~60° C./min.

14. The method of fabricating the gate dielectric layer of claim 12, wherein the rapid thermal annealing process is performed with a temperature rising rate of about 50~100° C./min.

15. A method of fabricating a semiconductor device, comprising the steps of:
    forming a nitrogen-containing gate dielectric layer over a substrate, the method of forming the nitrogen-containing gate dielectric layer comprising:
        performing a dilute wet oxidation process to form a gate dielectric layer over the substrate;
        performing a nitridation process to dope nitrogen into the gate dielectric layer; and
        performing an re-oxidation process for repairing the nitrogen-doped gate dielectric layer,
        wherein the dilute wet oxidation process, the nitridation process and the re-oxidation process are all carried out inside the same reaction chamber, and two of more wafers can be processed inside the reaction chamber at the same time;

forming a gate over the nitrogen-containing gate dielectric layer;

removing a portion of the nitrogen-containing gate dielectric layer using the gate as a mask; and forming a source region and a drain region in the substrate on the respective sides of the gate.

16. The method of fabricating the semiconductor device of claim 15, wherein the partial pressure of the water vapor in the dilute wet oxidation process is set between 0.1~10 Torr.

17. The method of fabricating the semiconductor device of claim 15, wherein the partial pressure of the water vapor in the dilute wet oxidation process is set between 0.1~5 Torr.

18. The method of fabricating the semiconductor device of claim 15, wherein the partial pressure of the water vapor in the dilute wet oxidation process is set between 0.1~1 Torr.

19. The method of fabricating the semiconductor device of claim 15, wherein the reactive gases used in the dilute wet oxidation process comprises oxygen, hydrogen and nitrogen.

20. The method of fabricating the semiconductor device of claim 15, wherein the gaseous mixture used in the nitridation process comprises ammonia ($NH_3$) and nitrogen ($N_2$).

21. The method of fabricating the semiconductor device of claim 20, wherein the ratio between nitrogen to ammonia in the gaseous mixture is between about 0.2~0.8.

22. The method of fabricating the semiconductor device of claim 20, wherein the gas flow rate of the gaseous mixture is between about 0.2~2 slm.

23. The method of fabricating the semiconductor device of claim 15, wherein the nitridation process is performed at a temperature between about 800~950° C.

24. The method of fabricating the semiconductor device of claim 15, wherein the nitridation process is performed at a pressure between about 10~120 mTorr.

25. The method of fabricating the semiconductor device of claim 15, wherein the gas used in the re-oxidation process is selected from a group consisting of oxygen ($O_2$), water vapor ($H_2O$), nitrogen monoxide (NO) and nitrous oxide ($N_2O$).

26. The method of fabricating the semiconductor device of claim 15, wherein the re-oxidation process comprises a dilute wet oxidation process or a rapid thermal annealing process.

27. The method of fabricating the semiconductor device of claim 26, wherein the rapid thermal annealing process is performed with a temperature dropping rate of about 30~60° C./min.

28. The method of fabricating the semiconductor device of claim 26, wherein the rapid thermal annealing process is performed with a temperature rising rate of about 50~100° C./min.

29. The method of fabricating the semiconductor device of claim 15, wherein the steps for forming the gate over the nitrogen-containing gate dielectric layer comprising:

forming a conductive layer over the nitrogen-containing gate dielectric layer;

forming a patterned photoresist layer over the conductive layer;

removing a portion of the conductive layer using the patterned photoresist layer as a mask; and removing the patterned photoresist layer.

30. The method of fabricating the semiconductor device of claim 29, wherein the step of removing a portion of the conductive layer comprises performing an etching process.

* * * * *